(12) United States Patent
Nakata

(10) Patent No.: US 8,320,821 B2
(45) Date of Patent: Nov. 27, 2012

(54) RECEIVING APPARATUS

(75) Inventor: Kazuhiro Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/993,515

(22) PCT Filed: May 11, 2009

(86) PCT No.: PCT/JP2009/002039
§ 371 (c)(1),
(2), (4) Date: Nov. 19, 2010

(87) PCT Pub. No.: WO2010/001521
PCT Pub. Date: Jan. 7, 2010

(65) Prior Publication Data
US 2011/0076971 A1    Mar. 31, 2011

(30) Foreign Application Priority Data

Jul. 4, 2008  (JP) ................................. 2008-175705

(51) Int. Cl.
  H04H 20/71  (2008.01)
  H04H 60/09  (2008.01)
  H04B 1/18   (2006.01)
  H04W 24/00  (2009.01)
(52) U.S. Cl. ... 455/3.01; 455/3.04; 455/134; 455/179.1; 455/185.1; 455/456.1
(58) Field of Classification Search ........ 455/3.01–3.06, 455/67.11, 132–135, 150.1, 160.1–161.3, 455/164.2, 184.1–185.1, 186.1, 226.1, 345, 455/456.1, 179.1
See application file for complete search history.

(56) References Cited

U.S. PATENT DOCUMENTS

| | | | | |
|---|---|---|---|---|
| 5,390,343 | A * | 2/1995 | Rupprecht et al. | 455/161.3 |
| 5,428,825 | A * | 6/1995 | Tomohiro et al. | 455/186.1 |
| 5,898,910 | A * | 4/1999 | Miyake et al. | 455/186.1 |
| 5,946,605 | A * | 8/1999 | Takahisa et al. | 455/68 |
| 6,980,769 | B2 * | 12/2005 | Toporski | 455/3.01 |
| 7,369,825 | B2 * | 5/2008 | Slupe | 455/161.3 |
| 7,447,488 | B2 * | 11/2008 | Howard et al. | 455/179.1 |
| 7,502,589 | B2 * | 3/2009 | Howard et al. | 455/3.06 |
| 7,596,119 | B2 * | 9/2009 | Buckley et al. | 370/331 |
| 7,756,464 | B2 * | 7/2010 | Uppala | 455/3.01 |
| 2006/0195239 | A1 * | 8/2006 | Teichner et al. | 701/36 |
| 2008/0299925 | A1 * | 12/2008 | Walley et al. | 455/161.1 |
| 2009/0029670 | A1 * | 1/2009 | Cho et al. | 455/344 |
| 2009/0280741 | A2 * | 11/2009 | Krinsky | 455/3.06 |
| 2010/0159836 | A1 * | 6/2010 | Lau et al. | 455/42 |

FOREIGN PATENT DOCUMENTS

EP  0892513(A2)  1/1999

(Continued)

Primary Examiner — Simon Nguyen
(74) Attorney, Agent, or Firm — Birch, Stewart, Kolasch & Birch, LLP

(57) ABSTRACT

A receiving apparatus discriminates RDS data containing traffic information corresponding to the vehicle's own position from RDS data of broadcasting stations searched for by frequency sweeping by a sub tuner front end 7; stores step by step into a pool memory 16 frequencies of alternative stations identified by each PI code of the RDS data and the number of the alternative stations; determines the PI code with the greatest number of the alternative stations by comparing the numbers of the alternative stations for individual PI codes stored in the pool memory 16 in a frequency sweeping range; and receives the traffic information from the station with the highest received electric field strength among all the alternative stations identified by the PI code determined.

2 Claims, 3 Drawing Sheets

FOREIGN PATENT DOCUMENTS

| | | |
|---|---|---|
| JP | 2-105731 A | 4/1990 |
| JP | 5-50832 U | 7/1993 |
| JP | 11-251944 A | 9/1999 |
| JP | 2002-64391 A | 2/2002 |

* cited by examiner

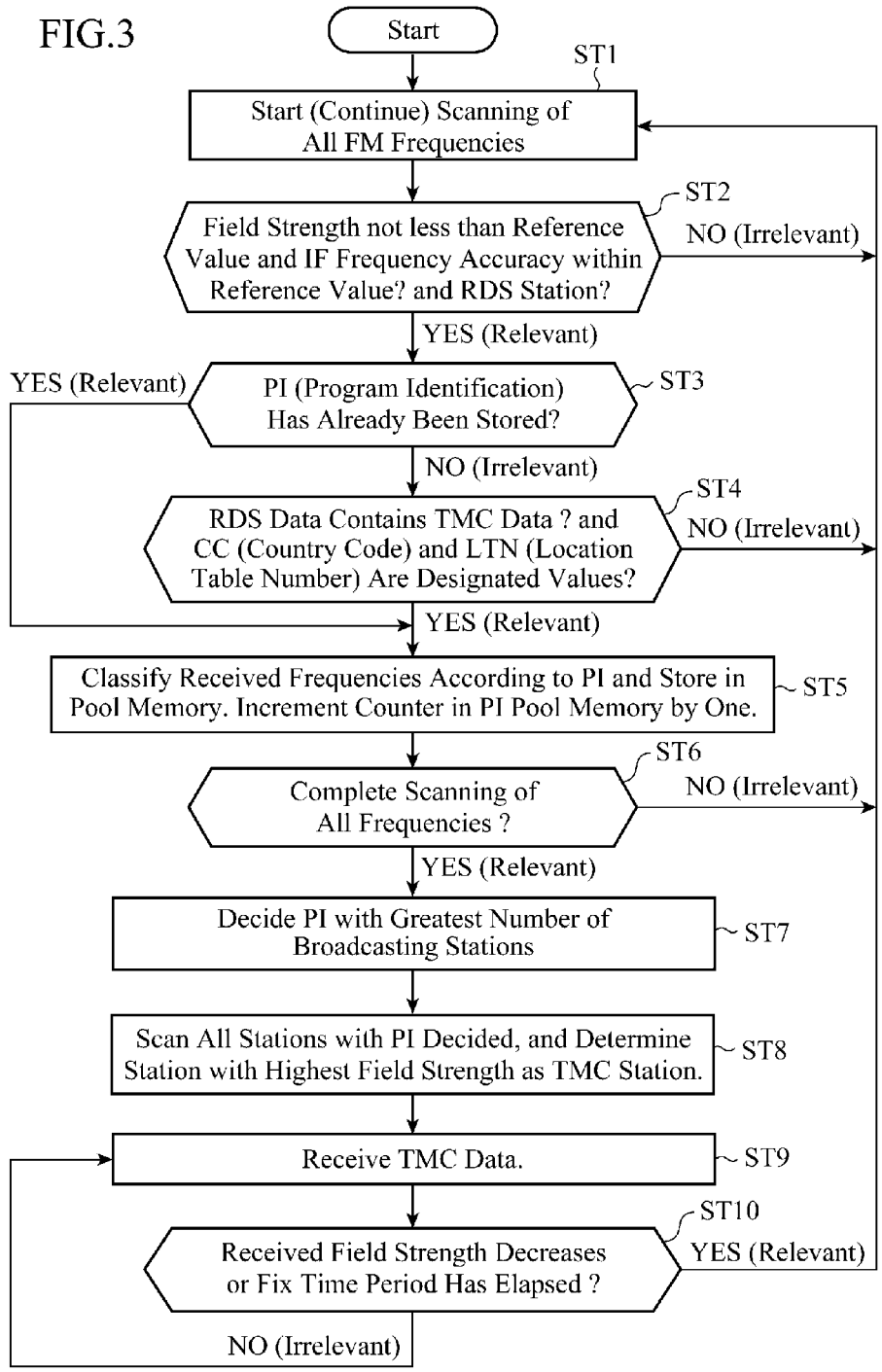

RECEIVING APPARATUS

TECHNICAL FIELD

The present invention relates to an onboard receiving apparatus, and particularly to a receiving apparatus for receiving an RDS group type containing traffic information (TMC: Traffic Message Channel) from an RDS (Radio Data System) station.

BACKGROUND ART

A conventional onboard receiving apparatus disclosed in Patent Document 1, when receiving the optimum traffic information for the vehicle's own position via an FM broadcast from an RDS station, uses a time period shorter than the interval between messages of traffic information broadcast periodically as a designated time, and checks the electric field strength of each RDS station in the area the vehicle is traveling after the designated time has elapsed from a start of a broadcast of the traffic information and a TP code for identifying that it is a traffic information broadcasting station, thereby tuning to the RDS station with the highest electric field strength immediately before the start of a traffic information broadcast. Thus, after tuning to the traffic information broadcasting station in the area the vehicle is traveling now, it can start the traffic information in a short time

PRIOR ART DOCUMENT

Patent Document

Patent Document 1: Japanese Utility Model Laid-Open No. 5-50832/1993

However, when a broadcasting station with large transmission power is present in a remote area from where the vehicle is traveling, the conventional receiving apparatus has a problem of being likely to select a station broadcasting traffic information unnecessary for the vehicle's own position by checking the received electric field strength.

The present invention is implemented to solve the foregoing problem. Therefore it is an object of the present invention to provide a receiving apparatus capable of receiving the traffic information relevant to the vehicle's own position appropriately.

DISCLOSURE OF THE INVENTION

A receiving apparatus in accordance with the present invention has a position detecting unit for detecting its own position, a first receiving system for reproducing radio sound by receiving a broadcast signal from a broadcasting station, and a second receiving system for receiving RDS data in the broadcast signal, wherein the second receiving system includes: an RDS demodulating unit for demodulating the RDS data in the broadcast signal; a decoder unit for reproducing from the RDS data a PI (Program Identification) code for identifying a broadcasting station and a region code of the broadcasting station; a memory unit for storing frequencies of alternative stations identified by a same PI code and the number of the alternative stations for each PI code; a PI decision unit for discriminating, from the RDS data of the broadcasting station searched for by frequency sweeping, the RDS data containing traffic information about the region code corresponding to the position information detected by the position detecting unit, for storing step by step into the memory unit frequencies of the alternative stations and the number of the alternative stations identified by each PI code of the RDS data, and for determining the PI code with the greatest number of the alternative stations by comparing the numbers of the alternative stations for individual PI codes stored in the memory unit in a frequency sweeping range; and a radio control unit for sweeping all the frequencies of the alternative stations identified by the PI code determined by the PI decision unit, and for receiving the traffic information from a station with the highest received electric field strength.

According to the present invention, it discriminates, from the RDS data of the broadcasting station searched for by frequency sweeping, the RDS data containing traffic information about the region code corresponding to the position information detected by the position detecting unit, stores step by step into the memory unit frequencies of the alternative stations and the number of the alternative stations identified by each PI code of the RDS data, determines the PI code with the greatest number of the alternative stations by comparing the numbers of the alternative stations for individual PI codes stored in the memory unit in a frequency sweeping range, sweeps all the frequencies of the alternative stations identified by the PI code determined by the PI decision unit, and receives the traffic information from the station with the highest received electric field strength. In this manner, it offers an advantage of being able to receive the traffic information about the vehicle's own position (position of the vehicle containing the receiving apparatus) appropriately.

BRIEF DESCRIPTION OF THE DRAWINGS

FIG. 3 is a flowchart showing an operation flow of the onboard radio receiver in FIG. 1.

BEST MODE FOR CARRYING OUT THE INVENTION

The best mode for carrying out the invention will now be described with reference to the accompanying drawings to explain the present invention in more detail.

Embodiment 1

Figure 1:
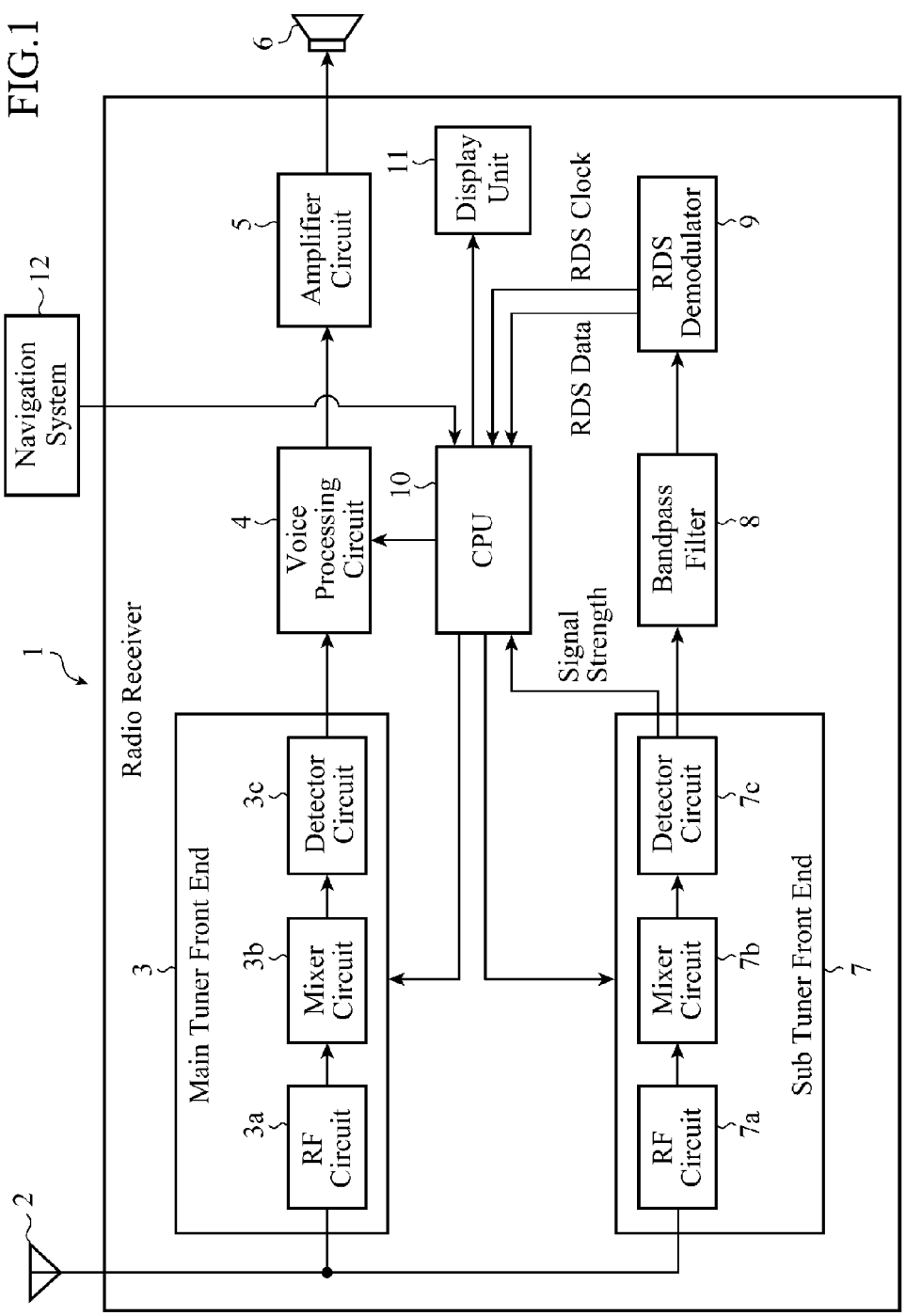
FIG. 1 is a block diagram showing a configuration of an onboard radio receiver to which a receiving apparatus of an embodiment 1 in accordance with the present invention is applied.

FIG. 1 is a block diagram showing a configuration of an onboard radio receiver to which a receiving apparatus of an embodiment 1 in accordance with the present invention is applied. In FIG. 1, the radio receiver 1 of the embodiment 1 has two tuners of main and sub, a radio antenna 2, a main tuner front end 3, a voice processing circuit 4, an amplifier circuit 5, a speaker 6, a sub tuner front end 7, a bandpass filter 8, an RDS demodulator (RDS demodulating unit) 9, a CPU 10, a display unit 11 and a navigation system (position detecting unit) 12.

The radio receiver 1 receives a plurality of broadcast waves via the radio antenna 2, and the broadcast waves are detected by the main tuner front end 3 and are supplied to the voice processing circuit 4 and then to the amplifier circuit 5. Components relating to the radio sound reproduction in the main tuner front end 3, voice processing circuit 4, amplifier circuit 5 and CPU 10 constitute a first receiving system for reproducing radio sound from a broadcast wave (broadcast signal).

An RF circuit 3a carries out radio frequency amplification by tuning to a received signal from the radio antenna 2. A mixer circuit 3b mixes the signal passing through the radio frequency amplification by the RF circuit 3a with a local oscillation frequency signal to generate an intermediate frequency (IF: 10.7 MHz) signal. A detector circuit 3c detects the intermediate frequency signal generated by the mixer circuit 3b and outputs a modulated signal.

The voice processing circuit 4, which is a component for performing sound processing on the signal from the main tuner front end 3, separates it into stereo signals. The amplifier circuit 5 amplifies the output of the voice processing circuit 4 to such a power level as enabling the sound output from the speaker 6. The speaker 6 receives the signal passing through the amplification with the amplifier circuit 5, and outputs radio sound.

In addition, components relating to the reproduction processing of the RDS data in the sub tuner front end 7, bandpass filter 8, RDS demodulator 9 and CPU 10 constitute a second receiving system for reproducing the RDS data extracted from the broadcast wave (broadcast signal).

The sub tuner front end 7 receives a broadcast from the RDS station via the radio antenna 2 and detects it, followed by supplying to the bandpass filter 8. The sub tuner front end 7 has an RF circuit 7a, a mixer circuit 7b and a detector circuit 7c. The RF circuit 7a tunes to one of the received signals from the radio antenna 2, and carries out radio frequency amplification. The mixer circuit 7b generates an intermediate frequency signal from the output of the RF circuit 7a. The detector circuit 7c detects the intermediate frequency signal generated by the mixer circuit 7b and outputs a modulated signal.

The bandpass filter 8 passes only the RDS modulation signal with a frequency of 57 kHz in the signal from the sub tuner front end 7. The RDS demodulator 9 demodulates the RDS modulation signal passing through the bandpass filter 8 to generate an RDS clock signal and RDS data.

The CPU 10 controls the front ends 3 and 7 and voice processing circuit 4, and extracts TMC data from the RDS data passing through the demodulation by the RDS demodulator 9, thereby creating display data. The display unit 11 receives the display data created by the CPU 10, and displays TMC information specified by the display data on a display screen.

Incidentally, the CPU 10 executes a TMC received station selecting program consistent with the objectives of the present invention, thereby implementing a received station selecting unit as a concrete means in which software and hardware cooperate. The received station selecting unit, using position information on the vehicle containing the radio receiver 1 (referred to as "vehicle's own position information" from now), which is acquired by the navigation system 12, and using the RDS data from the RDS demodulator 9, selects the RDS received station that provides the TMC information appropriated for the vehicle's own current position.

Figure 2:
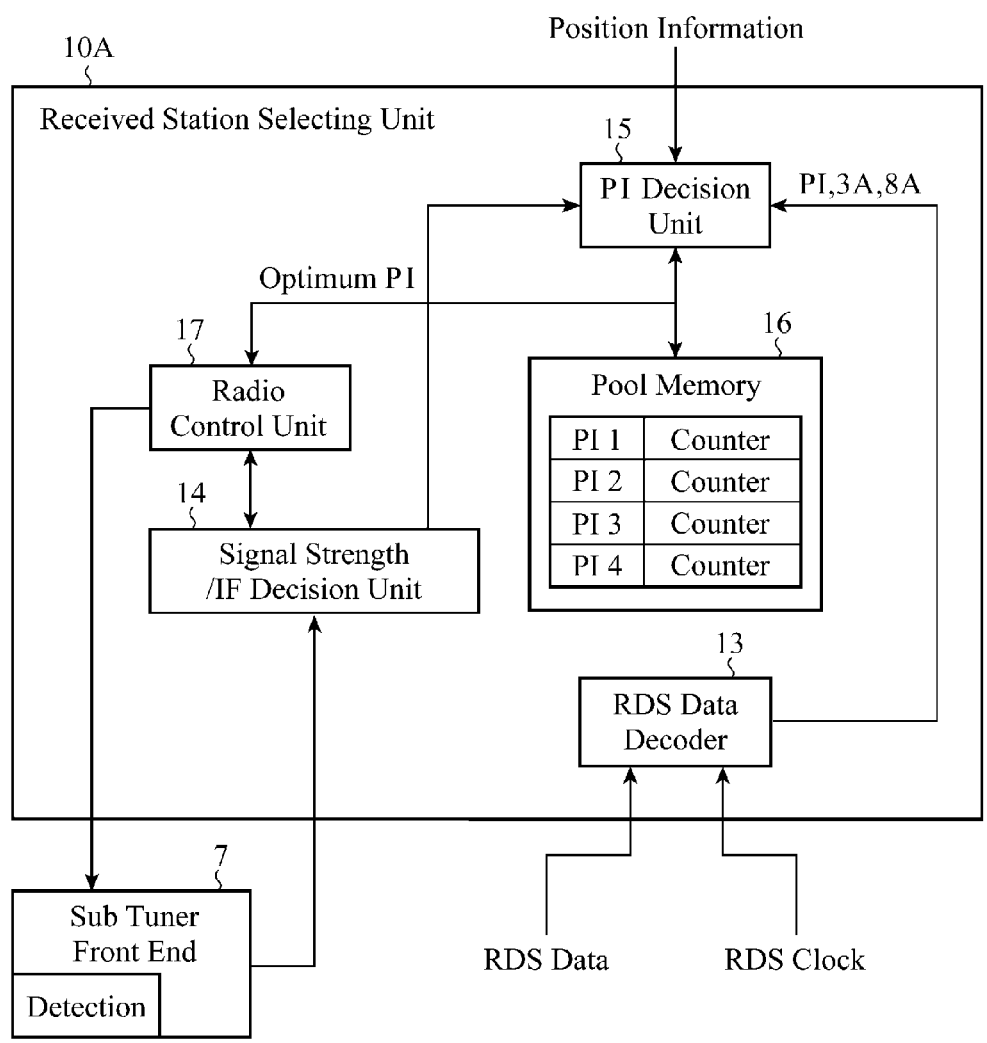
FIG. 2 is a block diagram showing a configuration of a received station selecting unit and its peripheral components.

FIG. 2 is a block diagram showing a configuration of the received station selecting unit described above and its peripheral components. In FIG. 2, the received station selecting unit 10A has an RDS data decoder (decoder unit) 13, a signal strength/IF decision unit 14, a PI decision unit 15, a pool memory (memory unit) 16 and a radio control unit 17.

The RDS data decoder 13 extracts the group type 8A containing the TMC data and the group type 3A from the RDS data the RDS station broadcasts. In addition, it extracts the PI (Program Identification) code from each group type.

Incidentally, the RDS data is transmitted continuously on a group type basis, which is a 104-bit data block. As for the group type, there are various types according to their purposes: the TMC data belongs to the group type 8A; and the country code (CC) and LTN (Location Table Number) belong to the group type 3A.

The signal strength/IF decision unit 14 receives the received electric field strength of the received signal the sub tuner front end 7 receives and its intermediate frequency signal, and makes a decision as to whether an intermediate frequency shift of the received signal is within a prescribed accuracy tolerance, and as to whether the received electric field strength is not less than a prescribed reference level.

According to the vehicle's own position information the navigation system 12 acquires and to the PI code and group types 3A and 8A the RDS data decoder 13 detects, the PI decision unit 15 counts the number of broadcasting stations having the same PI code in the area the vehicle is traveling, which is stored in the pool memory 16, thereby determining the PI code having the greatest number of alternative stations.

The pool memory 16 stores the PI codes of RDS stations that transmit the TMC data on the vehicle's own position, and has counters each for counting the number of the alternative stations with the same PI code. The PI decision unit 15 determines the PI code with the greatest number of alternative stations from the count values of the counters. The radio control unit 17 is a means for controlling the sub tuner front end 7, and causes the sub tuner front end 7 to tune to the RDS station with the PI code determined by the PI decision unit 15 and to receive the TMC data from the RDS station.

Next, the operation will be described.

FIG. 3 is a flowchart showing an operational flow of the onboard radio receiver in FIG. 1, and shows processing of selecting the received station of the TMC data.

First, the radio control unit 17 controls the sub tuner front end 7 to start the scanning of all the FM frequencies from the lower end frequency to the upper end frequency in the FM receiving frequency band (step ST1). Here, the sub tuner front end 7 supplies the received station selecting unit 10A with the electric field strength at the first frequency of the scanning and its intermediate frequency accuracy.

The signal strength/IF decision unit 14 of the received station selecting unit 10A makes a decision as to whether the electric field strength of the received signal supplied from the sub tuner front end 7 is not less than the prescribed reference level or not, and as to whether the intermediate frequency shift of the received signal is within the prescribed accuracy tolerance or not (step ST2). Here, if the electric field strength of the received signal is less than the prescribed reference level or if the intermediate frequency shift exceeds the prescribed accuracy tolerance, it decides that no station at the frequency is suitable for reception, and returns to step ST1 to execute the frequency scanning successively until a station suitable for reception is found.

On the other hand, when the received signal has electric field strength not less than the prescribed reference level and when the intermediate frequency shift is within the prescribed accuracy tolerance, the signal strength/IF decision unit 14 makes a decision that the station is suitable for reception, and notifies the PI decision unit 15 of that. Receiving the notification, the PI decision unit 15 proceeds to the processing at step ST3 when the received signal contains the RDS data. Unless it contains the RDS data, the PI decision unit 15, deciding that the broadcasting station from which the signal satisfying the foregoing standards is received is not an RDS station, proceeds to step ST1 where it repeats the foregoing processing until the RDS station is found.

At step ST3, using the PI code detected from the RDS data by the RDS data decoder 13, the PI decision unit 15 searches the PI codes stored in the pool memory 16, and makes a decision as to whether it is a PI code stored (pooled) in the pool memory 16 in advance.

In this case, if the current PI code is that which has not been stored in the pool memory 16 and corresponds to an RDS station received for the first time, the PI decision unit 15 makes a decision as to whether the RDS data has the TMC data belonging to the group type 8A and whether the country code (CC) and LTN belonging to the group type 3A are designated values or not (step ST4). Incidentally, the designated values are the country code value and LTN corresponding to the country and area where the vehicle is traveling, which are identified from the position information the PI decision unit 15 acquires from the navigation system 12.

At step ST4, even if it has the TMC data but the country code (CC) and LTN disagree with the designated values, the processing returns to step ST1 to execute the frequency scanning successively.

When making a decision that it contains the TMC data and that the country code (CC) and LTN agree with the designated values at step ST4, the PI decision unit 15 stores in the pool memory 16 the PI code and the receiving frequency of the RDS data containing the PI code while establishing correspondence between them, and increments the count value of the counter corresponding to the PI code by one. In contrast, when the PI code has already been stored in the pool memory 16, the PI decision unit 15 omits step ST4 and stores in the pool memory 16 the receiving frequency in association with the PI code, and increments the count value of the PI code by one in the same manner (step ST5).

After that, until a decision is made at step ST6 that all the FM frequencies have been scanned, the frequency scanning is carried out successively to repeat the processing from the foregoing step ST1 to step ST5. Thus, the pool memory 16 stores the receiving frequencies of the alternative stations successively for each PI code, and the number of the alternative stations is counted.

When the scanning of all the FM frequencies has been completed, the PI decision unit 15 refers to the counter value for each PI code stored in the pool memory 16 and decides the PI code having the greatest number of broadcasting stations eligible for alternative stations (step ST7). The PI code (optimum PI) determined by the decision is supplied from the PI decision unit 15 to the radio control unit 17.

The radio control unit 17 controls the sub tuner front end 7 to rescan the frequencies of all the alternative stations identified by the PI code (optimum PI) supplied from the PI decision unit 15. In this case, the signal strength/IF decision unit 14 compares the electric field strengths of the individual received signals obtained by the rescanning, determines the station with the highest electric field strength as a TMC received station, and notifies the radio control unit 17 of it (step ST8).

The radio control unit 17 controls the sub tuner front end 7 and starts receiving the TMC data from the station determined at step ST8 (step ST9). While the TMC data is being received, the signal strength/IF decision unit 14 makes a decision as to whether the prescribed permissible electric field strength (fixed value) is maintained or not by monitoring the electric field strength of the received signal, or whether a prescribed update time period has elapsed from the start of the TMC data reception or not (step ST10).

When the electric field strength maintains the prescribed permissible electric field strength or when the prescribed update time period has not elapsed, it continues receiving the TMC data. On the other hand, when the electric field strength falls below the prescribed permissible electric field strength (is less than the fixed value of the permissible electric field strength) or when the prescribed update time period has elapsed, the signal strength/IF decision unit 14 notifies the radio control unit 17 of that. Thus, the processing is returned to step ST1 to repeat the foregoing processing by restarting the scanning of all the FM frequencies.

As described above, according to the embodiment 1, it includes: the pool memory 16 that stores for each PI code the frequencies of the alternative stations identified by the same PI code and the number of the alternative stations ; the PI decision unit 15 that discriminates the RDS data containing the traffic information about the region code corresponding to the vehicle's position information from the RDS data of the broadcasting stations searched for by scanning (sweeping) the frequencies with the sub tuner front end 7, stores step by step the frequencies of the alternative stations identified by each PI code of the RDS data and the number of the alternative stations in the pool memory 16, and determines the PI code with the greatest number of the alternative stations by comparing the number of the alternative stations of the individual PI codes stored in the pool memory 16 within the sweeping range of the frequency; and the radio control unit 17 that controls the sub tuner front end 7 to sweep the frequencies of all the alternative stations identified by the PI code determined by the PI decision unit 15, and receives the traffic information from the station with the highest received electric field strength.

With such a configuration, it can select as the TMC received station the broadcasting station network having the greatest number of alternative broadcasting stations (stations having the same PI code) at the vehicle's own position, thereby being able to receive the TMC information about the vehicle's own position appropriately. Incidentally, it is considered that the vehicle is close to the center of the broadcasting station network, and that the RDS data from the broadcasting station network includes the greatest number of pieces of the TMC information required near the current vehicle's own position.

Incidentally, although the foregoing embodiment 1 is described by way of example that applies the receiving apparatus in accordance with the present invention to the onboard radio receiver 1, and employs the car navigation system 12 as a means for acquiring the position information, the present invention is not limited to such a configuration. For example, the present invention is applicable to any information terminal as long as it has both the radio receiving function and the position detecting function.

Industrial Applicability

As described above, to enable receiving the traffic information relevant to the vehicle's own position appropriately, the receiving apparatus in accordance with the present invention is configured in such a manner as to have the position detecting unit for detecting its own position, the first receiving system for reproducing radio sound by receiving the broadcast signal from a broadcasting station, and the second receiving system for receiving the RDS data in the broadcast signal, wherein the second receiving system includes: the RDS demodulating unit for demodulating the RDS data in the broadcast signal; the decoder unit for reproducing from the RDS data a PI (Program Identification) code for identifying a broadcasting station and the region code of the broadcasting station; the memory unit for storing frequencies of alternative stations identified by the same PI code and the number of the alternative stations for each PI code; the PI decision unit for discriminating, from the RDS data of the broadcasting station searched for by frequency sweeping, the RDS data containing traffic information about the region code corresponding to the position information detected by the position detecting unit, for storing step by step into the memory unit the frequencies of the alternative stations and the number of the alternative stations identified by each PI code of the RDS data, and for determining the PI code with the greatest number of the alternative stations by comparing the numbers of the alternative stations for individual PI codes stored in the memory unit in a frequency sweeping range; and the radio control unit for sweeping all the frequencies of the alternative stations identified by the PI code determined by the PI decision unit, and for receiving the traffic information from a station with the highest received electric field strength. Accordingly, it relates to an onboard receiving apparatus, and is particularly suitable for a receiving apparatus and the like for receiving the RDS group types containing the traffic information from the RDS station.

What is claimed is:

1. A receiving apparatus having a position detecting unit for detecting its own position, a first receiving system for reproducing radio sound by receiving broadcast signals from respective broadcasting stations, and a second receiving system for receiving RDS (Radio Data System) data in each broadcast signal, wherein the second receiving system comprises:

an RDS demodulating unit for demodulating the RDS data in each broadcast signal;

a memory unit for storing, in association with each of one or more PI (Program Identification) codes, a counted number of alternative stations identified by that PI code and respective frequencies of those alternative stations, each of the one or more PI codes being reproduced from the RDS data in a broadcast signal received from a respective broadcasting station;

a processor programmed to execute a process of:

discriminating, from the RDS data of each broadcasting station searched for by frequency sweeping, the RDS data containing traffic information about the region code corresponding to the position information detected by the position detecting unit, storing step by step into the memory unit frequencies of the alternative stations and the number of the alternative stations identified by each of the one or more PI codes of the RDS data, determining which of the one or more PI codes is associated with the highest number of the alternative stations by comparing the counted numbers of the alternative stations for individual PI codes stored in the memory unit in a frequency sweeping range, sweeping all the frequencies of the alternative stations identified by the determined PI code, and receiving the traffic information from the alternative station identified by the determined PI code with the highest received electric field strength.

2. The receiving apparatus according to claim 1, wherein the process further includes:

searching for a new broadcasting station when a prescribed update time period has elapsed from a start of receiving the traffic information or when the received electric field strength of the broadcast signal containing the traffic information becomes less than a permissible level; and updating storage contents of the memory unit by using the RDS data of the broadcasting station searched for, and making a new determination of which of the one or more PI code is associated with the highest number of the alternative stations.

* * * * *